(12) United States Patent
Li

(10) Patent No.: US 12,733,131 B2
(45) Date of Patent: Sep. 8, 2026

(54) IMMERSION WATER TANK AND SERVER COOLING SYSTEM

(71) Applicant: SUZHOU METABRAIN INTELLIGENT TECHNOLOGY CO., LTD., Suzhou (CN)

(72) Inventor: Mingjie Li, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 259 days.

(21) Appl. No.: 18/724,028

(22) PCT Filed: Feb. 23, 2023

(86) PCT No.: PCT/CN2023/077974

§ 371 (c)(1),
(2) Date: Jun. 25, 2024

(87) PCT Pub. No.: WO2024/055524

PCT Pub. Date: Mar. 21, 2024

(65) Prior Publication Data

US 2025/0063689 A1 Feb. 20, 2025

(30) Foreign Application Priority Data

Sep. 13, 2022 (CN) ......................... 202211108206.7

(51) Int. Cl.
*H05K 7/20* (2006.01)
*G06F 1/20* (2006.01)

(52) U.S. Cl.
CPC ........... *H05K 7/20272* (2013.01); *G06F 1/20* (2013.01); *H05K 7/20236* (2013.01); *H05K 7/20772* (2013.01)

(58) Field of Classification Search
CPC ................................................. H05K 7/20272
See application file for complete search history.

(56) References Cited

U.S. PATENT DOCUMENTS

2018/0246550 A1* 8/2018 Inaba ...................... G06F 1/206
2020/0029464 A1* 1/2020 Inano ................ H05K 7/20272

FOREIGN PATENT DOCUMENTS

CN 111240446 A 6/2020
CN 111405813 A 7/2020
(Continued)

OTHER PUBLICATIONS

CN-113301763-A English translation (Year: 2021).*
(Continued)

*Primary Examiner* — Mukundbhai G Patel
(74) *Attorney, Agent, or Firm* — Merchant & Gould P.C.

(57) ABSTRACT

Disclosed are an immersion water tank and a server cooling system. The immersion water tank comprises: a tank body provided with a plurality of storage units for placing cooling units therein; obstructing plates detachably mounted on side walls of the tank body so as to obstruct a cooling liquid in the corresponding storage unit when the cooling unit is separated from the tank body; a cooling unit support plate provided with liquid inlet portions for the cooling liquid to flow into the storage units; and spring-back baffles located below the cooling unit support plate, each spring-back baffle can block the liquid inlet portions when the cooling unit is separated from the cooling unit support plate. By arranging obstructing plates and spring-back baffles, the water tank provided in the present disclosure can effectively avoid the problem of the height reduction of a liquid level caused when a cooling unit is taken out, and the spring-back baffles are used to block the liquid inlet portions, preventing unnecessary liquid from flowing into an unused storage unit, thereby achieving the effect of improving the operation efficiency of the water tank.

20 Claims, 3 Drawing Sheets

(56) References Cited

FOREIGN PATENT DOCUMENTS

| | | | | | |
|---|---|---|---|---|---|
| CN | 112987884 | A | | 6/2021 | |
| CN | 113301763 | A | * | 8/2021 | ........... H05K 7/1488 |
| CN | 217064359 | U | * | 7/2022 | |
| CN | 115185356 | A | | 10/2022 | |

OTHER PUBLICATIONS

CN-217064359-U English translation (Year: 2022).*
Translation of PCT International Search Report mailed on May 29, 2023 for PCT/CN2023/077974 (2 pages).
Chinese Search Report for Application No. 2022111082067 (2 pages).

* cited by examiner

IMMERSION WATER TANK AND SERVER COOLING SYSTEM

CROSS-REFERENCE TO RELATED APPLICATION

This application is a National Stage Application of International Application No. PCT/CN2023/077974 filed on Feb. 23, 2023, which claims the benefit of Serial No. 202211108206.7 filed on Sep. 13, 2022 in China, and which applications are incorporated herein by reference. To the extent appropriate, a claim of priority is made to each of the above disclosed applications.

TECHNICAL FIELD

The present disclosure relates to the field of server cooling devices, and in particular, to an immersion water tank. In addition, the present disclosure further relates to a server cooling system comprising the immersion water tank above.

BACKGROUND

In the current server industry, air-cooled servers are the mainstay and the immersion server market is still in its infancy and not yet widespread.

In the related art, the immersion server is usually provided with a plurality of server nodes placed in a water tank, and the server can be cooled directly by being immersed in a liquid in the water tank, eliminating the need to install a fan in the system. In terms of maintenance, the immersion server is less convenient than traditional air-cooled servers, and when a server node needs to be maintained, the server node must be lifted out of the water tank using an external hoisting device.

However, in the existing immersion server architecture, when a server node is being maintained, the unused space in the water tank is increased as the server node is removed. In this case, the increased space is filled by the working liquid, causing the overall liquid level in the tank to drop. In order to prevent other server nodes that still in operation from experiencing the heat dissipation problems caused by insufficient liquid levels, the liquid in a secondary water tank is usually used to replenish the water tank and restore the liquid level to a predetermined safe level. Such an approach not only allows the working liquid to flow through the unused space without the need for heat dissipation, thereby reducing heat dissipation efficiency, but also requires that an adequate amount of reserve liquid is maintained in the secondary water tank at all times. Due to the current high cost per unit of liquid, the operation and maintenance costs are increased.

Therefore, how to effectively reduce the maintenance cost of the object to be cooled in the immersion water tank is a technical problem to be currently solved by those skilled in the art.

SUMMARY

An object of some embodiments of the present disclosure is to provide an immersion water tank, which is used for reducing maintenance costs of cooling units in the immersion water tank and reducing the usage amount of a cooling liquid. Another object of some embodiments of the present disclosure is to provide a server cooling system comprising the immersion water tank above.

In order to achieve the objects above, some embodiments of the present disclosure provide the following technical solutions:

an immersion water tank, comprising:

- a tank body, configured to store a cooling liquid, a plurality of storage units for placing cooling units being provided in the tank body;
- obstructing plates detachably mounted on side walls of the tank body so as to obstruct the cooling liquid in the corresponding storage unit when the cooling unit is separated from the tank body;
- a cooling unit support plate mounted on the side of the interior of the tank body close to a tank bottom, the cooling unit support plate being provided with liquid inlet portions for the cooling liquid to flow into the storage units; and
- spring-back baffles located below the cooling unit support plate, each spring-back baffle may block the liquid inlet portions after the cooling unit is separated from the cooling unit support plate.

In some embodiments, a plurality of limiting portions are provided on a side wall of the tank body in the longitudinal direction thereof, the limiting portions are located between adjacent storage units, and the obstructing plates are slidably connected to the limiting portions.

In some embodiments, the obstructing plate has a height greater than or equal to a height of the cooling unit support plate from the top of the tank body.

In some embodiments, the cooling unit support plate is provided with a plurality of liquid inlet portions at a position corresponding to each of the storage units.

In some embodiments, the liquid inlet portions are liquid inlet holes, and the liquid inlet holes are provided at a position on the cooling unit support plate close to the center of the storage unit.

In some embodiments, each spring-back baffle comprises a baffle body and elastic components which are mounted on the side of the baffle body close to the tank bottom; the elastic components may push the baffle body to be attached to the cooling unit support plate when the cooling unit is separated from the cooling unit support plate; and the cooling unit, when being close to the cooling unit support plate, may push the baffle body to compress the elastic components.

In some embodiments, pins are provided on the side of the baffle body close to the cooling unit support plate and pass through the cooling unit support plate, and when the cooling units are close to the cooling unit support plate, the baffle body is pushed by the pins to move towards the tank bottom.

In some embodiments, the side of the baffle body close to the cooling unit support plate is provided with sealing components for blocking the liquid inlet portions, and the positions of the sealing components and the liquid inlet portions are in one-to-one correspondence.

In some embodiments, the sealing component is a sealing gasket, and the sealing gasket has a size consistent with that of the liquid inlet portion.

In some embodiments, the side of the baffle body close to the tank bottom is provided with elastic component positioning portions for fixing the elastic components.

In some embodiments, the elastic component positioning portion is a boss provided on the baffle body, an elastic component positioning recess is provided in the boss, and a first end of the elastic component is mounted inside the elastic component positioning recess.

In some embodiments, the tank bottom is provided with elastic component clearance recesses, and a second end of the elastic component is mounted in each elastic component clearance recess.

In some embodiments, a liquid flow channel for the cooling liquid to flow is provided between the cooling unit support plate and the tank bottom.

In some embodiments, the elastic component clearance recess is further provided therein with an elastic component fixing pin for fixing the elastic component.

In some embodiments, the cooling unit support plate is of an integral structure, and liquid inlet portions are provided on the cooling unit support plate at a position corresponding to each storage unit.

In some embodiments, the number of the spring-back baffles is the same as that of the storage units, and the positions of the spring-back baffles and the storage units are in one-to-one correspondence.

In some embodiments, the spring-back baffles have a size less than a cross-sectional size of the storage units.

In some embodiments, a secondary water tank in communication with the tank body is further included.

Some embodiments of the present disclosure further provide a server cooling system comprising the immersion water tank in any one of the described embodiments.

Some embodiments of the present disclosure provide an immersion water tank, comprising: a tank body, configured to store a cooling liquid, a plurality of storage units for placing cooling units being provided in the tank body; obstructing plates detachably mounted on side walls of the tank body so as to obstruct the cooling liquid in the corresponding storage unit when the cooling unit is separated from the tank body; a cooling unit support plate mounted on the side of the interior of the tank body close to a tank bottom, the cooling unit support plate being provided with liquid inlet portions for the cooling liquid to flow into the storage units; and spring-back baffles located below the cooling unit support plate, each spring-back baffle may block the liquid inlet portions when the cooling unit is separated from the cooling unit support plate. By arranging obstructing plates and spring-back baffles, the immersion water tank provided in the some embodiments of the present disclosure can effectively avoid the problem of the height reduction of a liquid level caused when a cooling unit is taken out, and the spring-back baffle is used to block the liquid inlet portions, so as to prevent unnecessary liquid from flowing into an unused storage unit, thereby achieving the effect of improving the operation efficiency of the water tank.

In an embodiment, the spring-back baffle comprises a baffle body and elastic components which are mounted on the side of the baffle body close to the tank bottom; the elastic components may push the baffle body to be attached to the cooling unit support plate when the cooling unit is separated from the cooling unit support plate; and the cooling unit, when being close to the cooling unit support plate, may push the baffle body to compress the elastic components. By means of the arrangement of the elastic components, the above arrangement ensures that when the cooling unit is separated from the cooling unit support plate, the baffle body can be attached to the cooling unit support plate, thereby achieving the blocking effect for the liquid inlet portions and ensuring the sealing reliability; and at the same time, when the cooling unit is close to the cooling unit support plate, the baffle body can be pushed to compress the elastic components, thereby achieving the buffering effect and preventing the cooling unit from colliding with the tank bottom and causing damage.

The server cooling system provided in the some embodiments of the present disclosure is provided with the immersion water tank above. As the immersion water tank has the described technical effects, the server cooling system provided with the immersion water tank should also have corresponding technical effects.

BRIEF DESCRIPTION OF THE DRAWINGS

In order to describe the technical solutions in the embodiments of the present disclosure or in the related art more clearly, hereinafter, accompanying drawings requiring to be used for describing the embodiments or the related art are introduced briefly. Apparently, the accompanying drawings in the following description merely relate to some embodiments of the present disclosure, and for a person of ordinary skill in the art, other accompanying drawings can also be obtained according to these accompanying drawings without involving any inventive effort.

Figure 1:
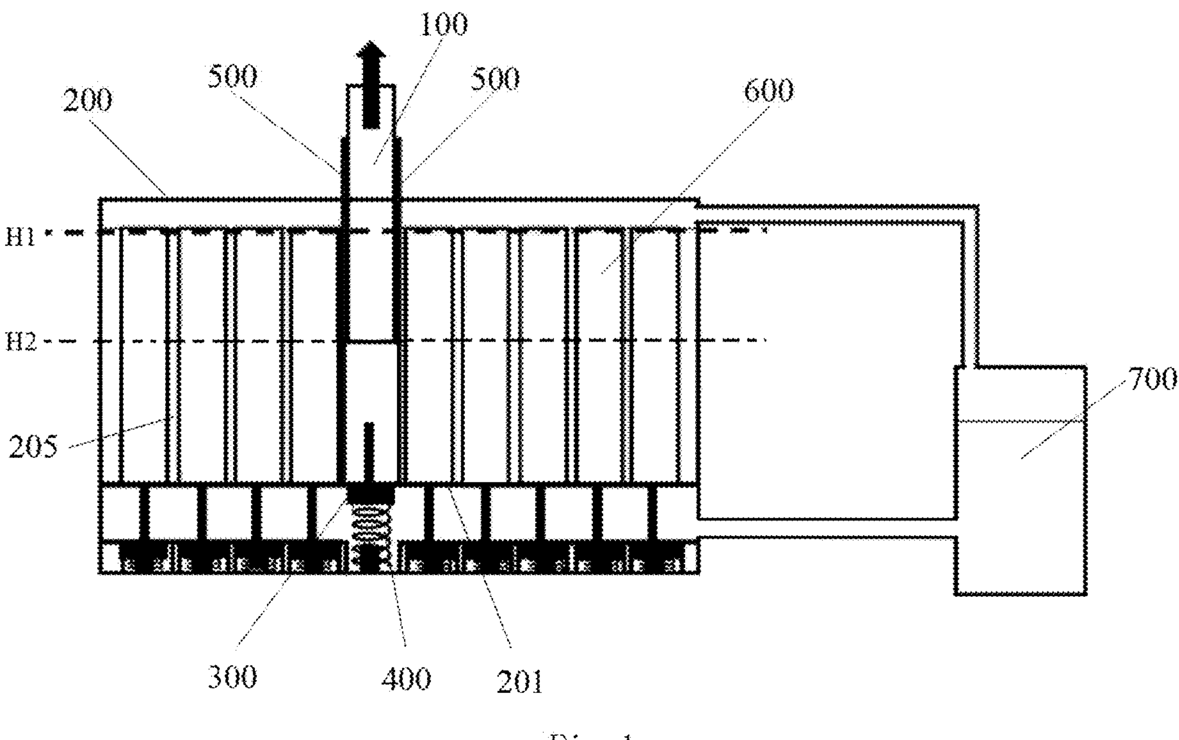
FIG. 1 is a schematic structural diagram of a specific embodiment of an immersion water tank provided according to some embodiments of the present disclosure.

In the drawings, cooling unit—100, tank body—200, cooling unit support plate—201, liquid inlet portion—202, elastic component fixing pin—203, elastic component clearance recess—204, limiting portion—205, spring-back baffle—300, baffle body—301, elastic component positioning recess—302, pin—303, sealing component—304, elastic component—400, obstructing plate—500, storage unit—600, secondary water tank—700, and liquid flow channel—800.

DETAILED DESCRIPTION OF THE EMBODIMENTS

To make a person skilled in the art better understand the solutions of some embodiments of the present disclosure, hereinafter, some embodiments of the present disclosure are further described in detail with reference to the accompanying drawings and the specific embodiments. Obviously, the embodiments as described are only some of the embodiments of the present disclosure, rather than all the embodiments. All other embodiments obtained by a person of ordinary skill in the art on the basis of the embodiments of the present disclosure without any inventive effort shall all fall within the scope of protection of the present disclosure.

In the following description, numerous specific details are set forth in order to provide a thorough understanding of some embodiments of the present disclosure. However, the present disclosure can be implemented in many other manners different from those described herein, and a person skilled in the art could make similar improvements without departing from the concept of the present disclosure, and therefore the present disclosure is not limited to the specific embodiments disclosed below.

The core of some embodiments of the present disclosure is to provide an immersion water tank, which can improve the operation efficiency of the immersion water tank and avoid energy waste. Another core of some embodiments of the present disclosure is to provide a server cooling system comprising the immersion water tank above.

To make a person skilled in the art better understand the solutions of some embodiments of the present disclosure, hereinafter, some embodiments of the present disclosure are further described in detail with reference to the accompanying drawings and the specific embodiments.

Figure 2:
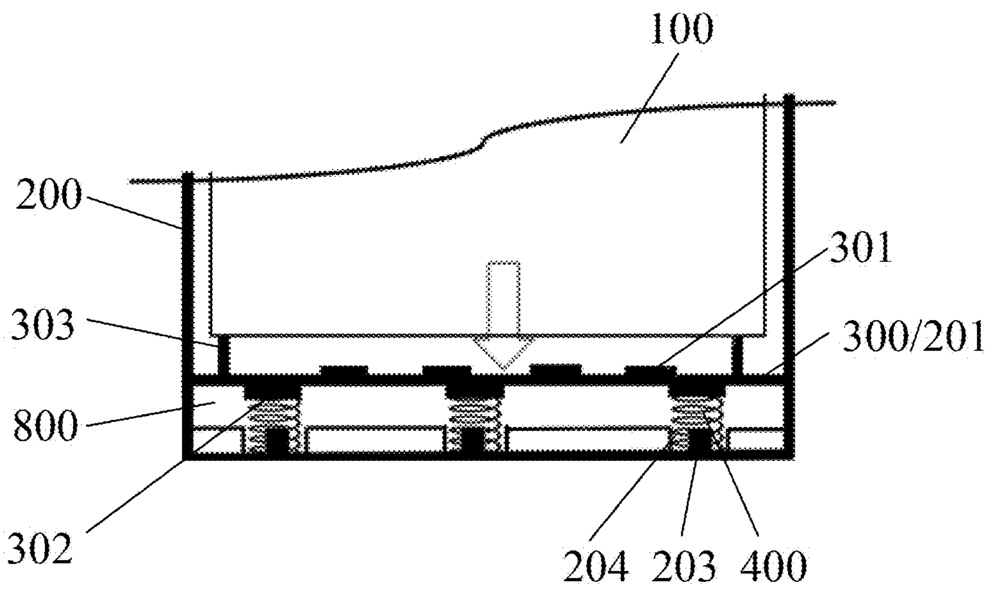
FIG. 2 is a schematic structural diagram of another specific embodiment of the immersion water tank provided according to some embodiments of the present disclosure.
Figure 3:
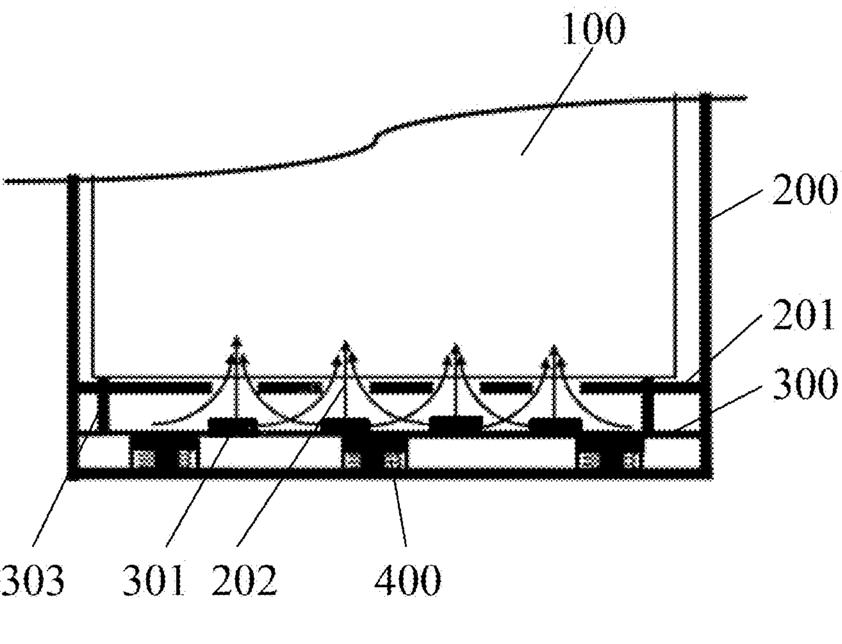
FIG. 3 is a schematic structural diagram of the immersion water tank shown in FIG. 2 after a cooling unit is installed.
Figure 4:
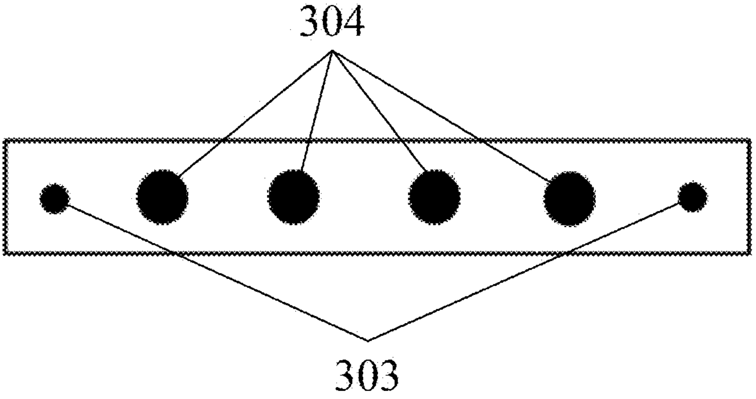
FIG. 4 is a top view of a spring-back baffle in the immersion water tank shown in FIG. 2.
Figure 5:
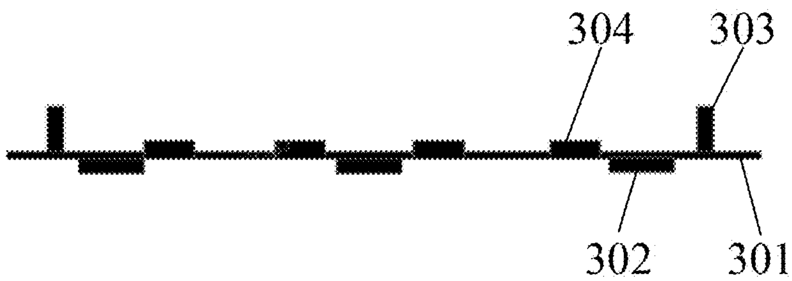
FIG. 5 is a front view of the spring-back baffle in the immersion water tank shown in FIG. 2.
Figure 6:
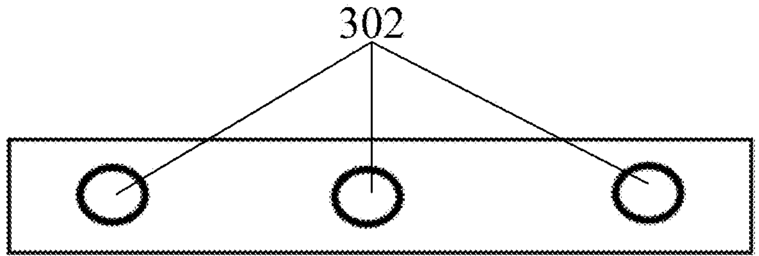
FIG. 6 is a bottom view of the spring-back baffle in the immersion water tank shown in FIG. 2.

Please refer to FIGS. 1-6, FIG. 1 is a schematic structural diagram of a specific embodiment of an immersion water tank provided according to some embodiments of the present disclosure; FIG. 2 is a schematic structural diagram of another specific embodiment of the immersion water tank provided according to some embodiments of the present disclosure; FIG. 3 is a schematic structural diagram of the immersion water tank shown in FIG. 2 after a cooling unit is installed; FIG. 4 is a top view of a spring-back baffle 300 in the immersion water tank shown in FIG. 2; FIG. 5 is a front view of the spring-back baffle 300 in the immersion water tank shown in FIG. 2; and FIG. 6 is a bottom view of the spring-back baffle 300 in the immersion water tank shown in FIG. 2.

In this embodiment, the immersion water tank comprises:

a tank body 200, configured to store a cooling liquid, a plurality of storage units 600 for placing cooling units 100 being provided in the tank body 200, i.e. a plurality of storage unit 600 nodes for placing the cooling units 100 are provided in the tank body 200, one cooling unit 100 is placed in a single storage unit 600, the volume of the storage unit 600 should be greater than that of the cooling unit 100, so as to ensure that after the cooling unit 100 is placed in the storage unit 600, there is enough cooling liquid around the cooling unit 100, ensuring the cooling effect for the cooling units 100; certainly, the volume of the storage unit 600 should also not be too large, so that the number of the storage units 600 can be increased as much as possible while ensuring the cooling effect for the cooling units 100, and the cooling of a larger number of the cooling units 100 can be satisfied at the same time; further, in order to ensure the normal operation of the tank body 200 and to reduce the influence of the external environment on the cooling liquid in the tank body 200, an upper cover is further provided on the tank body 200, and when maintenance of a cooling unit 100 is required, the upper cover can be first opened for operation, then the cooling unit 100 is put back after the maintenance of the cooling unit 100 is completed, and the upper cover is closed again;

obstructing plates 500, configured to obstruct the cooling liquid in the adjacent storage units 600, the obstructing plates 500 being detachably mounted on side walls of the tank body 200 so as to obstruct the cooling liquid in the corresponding storage unit 600 when the cooling unit 100 is separated from the tank body 200; specifically, the obstructing plates 500 can effectively prevent the cooling liquid from entering the corresponding storage unit 600 after the cooling unit 100 is separated from the storage unit 600, thereby effectively preventing the reduction of the liquid level of other storage units 600, and ensuring the cooling effect of the water tank on the other cooling units 100; in addition, compared to the method of supplementing liquid with a secondary water tank in the related art, the usage amount of the cooling liquid is effectively avoided, thereby effectively reducing the cost; furthermore, the obstructing plates 500 are detachably mounted on side walls of the tank body 200, by means of the movable arrangement of the obstructing plates 500, the flexibility of mounting between the obstructing plates 500 and the tank body 200 is increased, facilitating the use of the obstructing plates 500 with respect to different storage units 600, and facilitating the operation; and before the cooling unit 100 is separated from the tank body 200, the obstructing plates 500 are mounted on the side walls of the tank body 200, and the obstructing plates 500 are detached from the tank body 200 after the cooling unit 100 is put back into the tank body 200;

a cooling unit support plate 201 mounted on the side of the interior of the tank body 200 close to a tank bottom, the cooling unit support plate 201 being provided with liquid inlet portions 202 for the cooling liquid to flow into the storage units 600; specifically, a channel for accommodating a spring-back baffle 300 and for the cooling liquid to flow is provided between the cooling unit support plate 201 and the bottom of the tank body 200, so that the liquid fluidity of other storage units 600 in the water tank is not affected during maintenance of an individual cooling unit 100, thereby reducing the influence on the cooling units 100 in the other storage units 600, and it can be ensured that the cooling liquid can again flow in the corresponding storage unit 600 successfully when the cooling unit 100 is put back onto the cooling unit support plate 201 after the maintenance is completed; and a spring-back baffle 300 located below the cooling unit support plate 201, the spring-back baffle 300 may block the liquid inlet portions 202 when the cooling unit 100 is separated from the cooling unit support plate 201; specifically, the spring-back baffle 300 blocks the liquid inlet portions 202 of the cooling unit support plate 201, thereby effectively preventing the cooling liquid from flowing into the corresponding storage unit 600 when the cooling unit 100 is taken out for maintenance, and from affecting the cooling effect of the cooling units 100 in other storage units 600.

It should be noted that the cooling unit 100 is preferably a server, that is, the immersion water tank is preferably used as an immersion water tank for the server and is used to cool a plurality of servers. Certainly, the immersion water tank may also be used for other purposes, and a scenario in which a plurality of cooling units 100 need to be cooled may be used.

In the immersion water tank provided in some embodiments of the present disclosure, by means of the arrangements of the movable obstructing plates 500 and the spring-back baffles 300, the height reduction of the overall liquid level caused during maintenance of a single node can be avoided, and by means of the design of the bottom spring-back baffles 300, an unnecessary liquid can be prevented from passing through a channel of a storage unit 600 on which a node is not placed, such that not only the heat dissipation efficiency of the overall water tank can be improved, but also the dual effects of saving the liquid usage amount and reducing the operation and maintenance costs are further achieved.

In some embodiments, as shown in FIG. 1, a plurality of limiting portions 205 are provided on a side wall of the tank body 200 in the longitudinal direction thereof. Specifically, the limiting portions 205 may be tracks which extend in the longitudinal direction of the tank body 200, and the tracks are located between adjacent storage units 600 and are used for obstructing two adjacent storage units 600, and the obstructing plates 500 are slidably connected to the tracks. Specifically, by means of the obstructing plates 500 being detachably connected to the tracks, a movable design of the obstructing plates 500 is achieved. Before a storage unit 600 node is to be maintained, the obstructing plates 500 on two sides of the storage unit 600 node are first inserted into tracks reserved in the water tank, installation tracks of the obstructing plates 500 need to be provided in the water tank between the storage unit 600 nodes, the obstructing plates 500 should be higher than the liquid level after the installation of the obstructing plates 500, and a cooling unit 100 in the storage unit 600 node to be maintained is pulled out after the positioning of the obstructing plates 500 is completed. In this case, due to the obstructing effect of the obstructing plates 500, the liquid level of other nodes that are in normal operation does not change, for example, the standard liquid level is H1 in FIG. 1, and only the liquid level of the storage unit 600 node that is being maintained is reduced, for example, the reduced liquid level is H2 in FIG. 1.

Alternatively, the limiting portions 205 may be grooves which extend in the longitudinal direction of the tank body 200, the grooves are located between adjacent storage units 600 and are used for obstructing two adjacent storage units 600, and the obstructing plates 500 are slidably connected to the grooves. Specifically, by means of the obstructing plates 500 being detachably connected to the grooves, a movable design of the obstructing plates 500 is achieved. Before a storage unit 600 node is to be maintained, the obstructing plates 500 on two sides of the storage unit 600 node are first inserted into grooves reserved in the water tank, and the grooves of the obstructing plates 500 need to be provided in the water tank between the storage unit 600 nodes.

In some embodiments, in order to ensure that the height of the obstructing plates 500 is greater than that of the cooling liquid in the tank body 200, and due to the liquid level may change when the water tank is in use, or the liquid level may be affected by the fluctuation of the liquid surface, and therefore the height of the obstructing plates 500 is set to be greater than or equal to that of the cooling unit support plate 201 from the top of the tank body 200, that is, after the obstructing plates 500 are installed in place, the top of the obstructing plates 500 is flush with the top of the tank body 200, or the top of the obstructing plates 500 is higher than the top of the tank body 200. Such an arrangement can avoid possible changes in the liquid level in the water tank, or the liquid level from being affected by the fluctuation of the liquid surface, further improving the reliability.

It should be noted that, when the obstructing plates 500 are installed in place, the bottom of the obstructing plates 500 should abut against the cooling unit support plate 201, so as to reduce the entry of the cooling liquid into the corresponding storage unit 600 through the gap between the bottom of the obstructing plates 500 and the cooling unit support plate 201. Meanwhile, a sealing gasket should also be provided between the obstructing plates 500 and the tracks, for example, a rubber layer may be provided on each track, or rubber layers may be provided on two sides of the obstructing plates 500, so as to reduce entry of the cooling liquid into the corresponding storage unit 600 through the gap between the side faces of the obstructing plates 500 and the tracks.

In some embodiments, a plurality of liquid inlet portions 202 are provided on the cooling unit support plate 201 at a position corresponding to each storage unit 600. Specifically, the number of the liquid inlet portions 202 is preferably multiple, so as to ensure sufficient flow of the cooling liquid passing through the cooling unit support plate 201, thereby improving the circulation effect of the cooling liquid and ensuring the cooling effect of the cooling unit 100 after maintenance.

In some embodiments, the liquid inlet portions 202 are liquid inlet holes, and the liquid inlet holes are provided at the position on the cooling unit support plate 201 close to the center of the storage unit 600. Such an arrangement is used for ensuring a quick return flow of liquid after the spring-back baffle 300 is away from the cooling unit support plate 201. In addition, the liquid inlet hole is provided at a position on the cooling unit support plate 201 close to the center of the storage unit 600, that is, the spring-back baffle 300 blocks the liquid inlet hole at the relatively center of the storage unit 600, facilitating the application of force, improving the reliability of sealing the liquid inlet hole by the spring-back baffle 300, and preventing the cooling liquid from flowing into the storage unit 600 through the liquid inlet holes on the cooling unit support plate 201. Meanwhile, the liquid inlet holes are provided at a position on the cooling unit support plate 201 close to the center of the storage unit 600, which can also be used for reserving a sufficient space for the installation of the pins 303 in the spring-back baffle 300. Preferably, the liquid inlet holes are circular holes, which is easy to process, can reduce the processing cost, has a small resistance to the cooling liquid, and facilitates the circulation of the cooling liquid.

In some embodiments, the cooling unit support plate 201 is of an integral structure, and a plurality of liquid inlet portions 202 are provided on the cooling unit support plate 201 at a position corresponding to each storage units 600; the cooling unit support plate 201 in the water tank is preferably of an integral structure, and a plurality of liquid inlet holes are provided on the cooling unit support plate 201 at a position corresponding to each storage unit 600; certainly, a cooling unit support plate 201 may also be separately provided at a position corresponding to each storage unit 600. In order to facilitate processing, preferably, a same cooling unit support plate 201 is used in the water tank, and then liquid inlet holes are provided at a position corresponding to each storage unit 600. This selection not only facilitates processing, but also improves the strength and stability of the cooling unit support plate 201, and ensures the bearing effect of the cooling unit support plate 201 for the cooling unit 100.

In some embodiments, the number of the spring-back baffles 300 is the same as that of the storage units 600, and the positions of the spring-back baffles 300 and the storage units 600 are in one-to-one correspondence. Specifically, the spring-back baffles 300 satisfy the maintenance requirements for a cooling unit 100 in a single storage unit 600.

In some embodiments, the spring-back baffles 300 have a size smaller than the cross-sectional size of the storage units 600, the spring-back baffles 300 only need to satisfy the requirement of blocking the liquid inlet holes, and there is no need a large size, reducing the volume, and providing a sufficient space for the flow of the cooling liquid at an inner bottom of the tank body 200.

In some embodiments, a secondary water tank 700 in communication with the tank body 200 is further included. The secondary water tank 700 can supplement a cooling liquid for the tank body 200, specifically, with the volatilization of the cooling liquid in the tank body 200, the volume of the cooling liquid gradually decreases, and when the volume of the cooling liquid in the tank body 200 is smaller than a target volume, the cooling liquid in the secondary water tank 700 is added into the tank body 200. As the volatilization of the cooling liquid is slow, there is no need to store much cooling liquid in the secondary water tank 700, reducing the usage amount of the cooling liquid.

In some embodiments, the spring-back baffle 300 comprises a baffle body 301 and elastic components 400, the elastic components 400 can drive the baffle body 301 to be closely attached to the cooling unit support plate 201, thereby blocking the liquid inlet holes on the cooling unit support plate 201 by the baffle body 301.

Further, the elastic components 400 are mounted on the side of the baffle body 301 close to the tank bottom; when the cooling unit 100 is separated from the cooling unit support plate 201, the elastic components 400 can push the baffle body 301 to be attached to the cooling unit support plate 201; and when the cooling unit 100 is close to the cooling unit support plate 201, the baffle body 301 can be pushed to compress the elastic components 400.

That is to say, the elastic components 400 are located between the baffle body 301 and the tank bottom of the tank body 200, when the baffle body 301 is forced to move towards the tank bottom, the elastic components 400 are compressed, and when the baffle body 301 is no longer forced, the elastic components 400 are restored under the action of an elastic force, so as to push the baffle body 301 to move towards a direction close to the cooling unit support plate 201, thereby achieving the purpose that the baffle body 301 blocks the liquid inlet holes on the cooling unit support plate 201. Certainly, the elastic components 400 may also be provided between the baffle body 301 and the cooling unit support plate 201, when the baffle body 301 is forced to move towards the tank bottom, the elastic components 400 are stretched, and when the baffle body 301 is no longer forced, the elastic components 400 are restored under the action of the elastic force, so as to push the baffle body 301 to move towards a direction close to the cooling unit support plate 201, thereby achieving the purpose that the baffle body 301 blocks the liquid inlet holes on the cooling unit support plate 201. Certainly, in order to ensure the blocking effect of the baffle body 301 on the liquid inlet holes on the cooling unit support plate 201, it is preferable that the elastic components 400 are located between the baffle body 301 and the tank bottom of the tank body 200.

It should be noted that the number of the spring-back baffles 300 in the water tank is multiple, each storage unit 600 node is provided with one spring-back baffle 300, and the spring-back baffles 300 are used for a single storage unit 600, so as to block the liquid inlet holes of the single storage unit 600.

By means of the arrangement of the elastic components 400, the above arrangement ensures that when the cooling units 100 are separated from the cooling unit support plate 201, the baffle body 301 can be attached to the cooling unit support plate 201, achieving the blocking effect for the liquid inlet portions 202, and ensuring sealing reliability; and at the same time, when the cooling units 100 are close to the cooling unit support plate 201, the baffle body 301 can be pushed to compress the elastic components 400, achieving the buffering effect, so as to prevent the cooling units 100 from colliding with the tank bottom and causing damage.

In some embodiments, pins 303 are provided on the side of the baffle body 301 close to the cooling unit support plate 201, and the pins 303 pass through the cooling unit support plate 201. Specifically, a through hole for each pin 303 to pass through is provided on the cooling unit support plate 201. When the cooling unit 100 is close to the cooling unit support plate 201, the baffle body 301 is pushed by the pins 303 to move towards the tank bottom. Further, the pins 303 and the through holes should be sealed to prevent the cooling liquid from entering the storage units 600 through the gap between the pins 303 and the through holes.

Specifically, there are preferably two pins 303, which are respectively located at positions of the baffle body 301 close to left and right sides, and when the cooling unit 100 is close to the cooling unit support plate 201, the baffle body 301 is smoothly pushed by the pins 303 at two sides of the baffle body 301 to move towards the tank bottom, thereby ensuring the stability of the movement of the baffle body 301.

Further, the pins 303 on the baffle body 301 may correspond to the positions of the liquid inlet holes of the cooling unit support plate 201, that is, each pin 303 may be provided in the center of the sealing gasket. In this way, there is no need to provide a through hole for the pin 303 to pass through on the cooling unit support plate 201, and the liquid inlet hole is used as a through hole for the pin 303 to pass through, thereby reducing the processing of a through hole. When the cooling unit 100 is close to the cooling unit support plate 201, the baffle body 301 is pushed to move towards the tank bottom by means of the pin 303 at the position of the liquid inlet hole.

It should be noted that, in order to prevent the pin 303 from affecting the liquid inlet hole, the cross-sectional size of the pin 303 should be obviously smaller than that of the liquid inlet hole, so as to ensure that the cooling liquid can flow into the storage unit 600 through the liquid inlet hole smoothly.

In some embodiments, protrusions are provided on the side of the cooling unit 100 close to the cooling unit support plate 201, and the protrusions pass through the cooling unit support plate 201. Specifically, a through hole for each protrusion to pass through is provided on the cooling unit support plate 201, and when the cooling unit 100 is close to the cooling unit support plate 201, the baffle body 301 is pushed by the protrusions to move towards the tank bottom. Specifically, there are preferably two protrusions, which are respectively located at positions of the cooling unit 100 close to left and right sides, and when the cooling unit 100 is close to the cooling unit support plate 201, the baffle body 301 is smoothly pushed by the protrusions at two sides of the cooling unit 100 to move towards the tank bottom, thereby ensuring the stability of the movement of the baffle body 301. Further, the protrusions on the cooling unit 100 may correspond to the positions of the liquid inlet holes of the cooling unit support plate 201. In this way, there is no need to provide a through hole for the protrusion to pass through on the cooling unit support plate 201, and the liquid inlet hole is used as a through hole for the protrusion to pass through, thereby reducing the processing of a through hole. When the cooling unit 100 is close to the cooling unit support plate 201, the protrusion will pass through the liquid inlet hole, and the baffle body 301 is pushed to move towards the tank bottom. It should also be noted that, in order to prevent the protrusion from affecting the liquid inlet hole, the cross-sectional size of the protrusion should be obviously smaller than that of the liquid inlet hole, so as to ensure that the cooling liquid can flow into the storage unit 600 through the liquid inlet hole smoothly.

In some embodiments, the side of the baffle body 301 close to the cooling unit support plate 201 is provided with sealing components 304 for blocking the liquid inlet portions 202, the positions of the sealing components 304 and the liquid inlet portions 202 are in one-to-one correspondence, and the size of the sealing components 304 may be slightly larger than that of the liquid inlet portions 202, so as to ensure a good sealing effect. Preferably, in order to save the usage amount of the material of the sealing components 304, the sealing components 304 are preferably sealing gaskets, and the size of the sealing gaskets is consistent with that of the liquid inlet portions 202; that is, the sealing gaskets is used to seal the periphery of the liquid inlet portions 202, so as to prevent the cooling liquid from entering the storage units 600 along the gap between the sealing components 304 and the liquid inlet portions 202. Further, the material of the sealing gaskets may be replaced with rubber or other soft material.

In some embodiments, the liquid inlet portion 202 is a circular liquid inlet hole, the sealing component 304 is an annular sealing gasket, the inner diameter of the sealing gasket is smaller than the diameter of the liquid inlet hole, and the outer diameter of the sealing gasket is larger than the diameter of the liquid inlet hole, such that the sealing gasket can just cover the entire outer periphery of the liquid inlet hole. Specifically, the pins 303 on the baffle body 301 may be provided on two sides of the baffle body 301, and may also be provided in the middle of the sealing gasket.

In some implementations, the side of the baffle body 301 close to the tank bottom is provided with elastic component positioning portions for fixing the elastic components, and each elastic component positioning portion may be a boss or a recess for fixing the first end, so as to prevent the elastic component 400 from deviating.

In some embodiments, the elastic component positioning portion is a boss provided on the baffle body 301, an elastic component positioning recess 302 is provided inside the boss, and the first end of the elastic component 400 is mounted in the elastic component positioning recess 302, i.e. the fixing of the elastic component 400 and the baffle body 301 is achieved by means of the elastic component positioning recess 302.

In some embodiments, the tank bottom is provided with elastic component clearance recesses 204, and the second end of each elastic component 400 is installed in the elastic component clearance recess 204, i.e. the fixing of the elastic component 400 and the tank body 200 is achieved by means of the elastic component clearance recess 204.

In some embodiments, the elastic component accommodating recess 204 is further provided with an elastic component fixing pin 203 used for fixing the elastic component 400. Specifically, the elastic component fixing pin 203 is fixedly connected to one end of the elastic component 400, so that the elastic component 400 can be prevented from detaching from the elastic component clearance recess 204 and affecting use; and certainly, an end portion of the elastic component 400 may also be directly fixed at the bottom of the elastic component clearance recess 204.

In some embodiments, the elastic component 400 is a spring or an elastic structural member such as an elastic sheet, and if the elastic component 400 is a spring, it can be conveniently installed and fixed. Specifically, the first end of the elastic component 400 is inserted into the elastic component positioning recess 302, and the second end of the elastic component 400 is inserted into the elastic component clearance recess 204. By using the elastic component positioning recess 302 and the elastic component clearance recess 204, the positioning of two ends of the elastic component 400 is achieved, ensuring the deformation stability of the elastic component 400. The elastic component 400 is preferably a spring, and can be conveniently assembled with the elastic component positioning recess 302 and the elastic component clearance recess 204, and both the elastic component positioning recess 302 and the elastic component clearance recess 204 are preferably circular recesses. In addition, the elastic component positioning recess 302 and the elastic component clearance recess 204 are preferably in interference fit with two ends of the elastic component 400, ensuring the firmness of the connection.

In the immersion water tank, the process of removing a cooling unit 100 to be maintained during maintenance of a node comprises the following processes:

an upper cover of the water tank is opened;

according to the cooling unit 100 to be maintained, the position of a storage unit 600 to be maintained is determined;

obstructing plates 500 are inserted into two sides of the storage unit 600 to be maintained;

the cooling unit 100 is extracted;

the spring-back baffle 300 and the cooling unit support plate 201 are closed; and the upper cover of the tank body 200 is closed.

Further, the process of placing the cooling unit 100 after maintenance comprises the following processes:

the upper cover of the water tank is opened;

the cooling unit 100 is inserted back into the corresponding storage unit 600;

the spring-back baffle 300 and the cooling unit support plate 201 are opened;

the obstructing plates 500 at two sides of the storage unit 600 are removed; and the upper cover of the tank body 200 is closed.

Embodiment One

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. A limiting portion 205 is provided on the tank body 200 between every two adjacent storage units 600, the limiting portion 205 is a track or a groove, the limiting portion 205 extends in the longitudinal direction of the tank body 200, and the obstructing plate 500 can be mounted on the limiting portion 205. The cooling unit support plate 201 is mounted in the inner lower part of the tank body 200 and is used for supporting the cooling unit 100, and liquid inlet holes are provided on the cooling unit support plate 201. When the cooling unit 100 is placed in the tank body 200, the spring-back baffle 300 can be separated from the cooling unit support plate 200 for the cooling liquid to enter the storage units 600 via the liquid inlet holes; and when the cooling unit 100 is taken out of the tank body 200, the spring-back baffle 300 can be restored and is attached to the cooling unit support plate 201 for sealing the liquid inlet holes, thereby preventing the cooling liquid from entering the storage units 600 via the liquid inlet holes.

Embodiment Two

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. The cooling unit support plate 201 is mounted in the inner lower part of the tank body 200 and is used for supporting the cooling unit 100, and liquid inlet holes are provided on the cooling unit support plate 201. When the cooling unit 100 is placed in the tank body 200, the spring-back baffle 300 can be separated from the cooling unit support plate 200 for the cooling liquid to enter the storage units 600 via the liquid inlet holes; and when the cooling unit 100 is taken out of the tank body 200, the spring-back baffle 300 can be restored and is attached to the cooling unit support plate 201 for sealing the liquid inlet holes, thereby preventing the cooling liquid from entering the storage units 600 via the liquid inlet holes.

Embodiment Three

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. Each spring-back baffle 300 comprises a baffle body 301 and elastic components 400 located at the bottom of the baffle body 301. The cooling unit support plate 201 is mounted in the inner lower part of the tank body 200 and is used for supporting the cooling unit 100, and liquid inlet holes are provided on the cooling unit support plate 201. When the cooling unit 100 is placed in the tank body 200, the baffle body 301 moves downwards and compresses the elastic components 400, and the baffle body 301 is separated from the cooling unit support plate 200 for the cooling liquid to enter the storage units 600 via the liquid inlet holes; and when the cooling unit 100 is taken out of the tank body 200, the elastic components 400 push the baffle body 301 to be restored and attached to the cooling unit support plate 201 for sealing the liquid inlet holes, thereby preventing the cooling liquid from entering the storage units 600 via the liquid inlet holes.

Embodiment Four

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. Each spring-back baffle 300 comprises a baffle body 301, elastic components 400 located at the bottom of the baffle body 301 and pins 303 located above the baffle body 301. The cooling unit support plate 201 is mounted in the inner lower part of the tank body 200 and is used for supporting the cooling unit 100, and liquid inlet holes are provided on the cooling unit support plate 201. When the cooling unit 100 is placed in the tank body 200, the cooling unit 100 is first in contact with the pins 303, the pins 303 are forced to transmit to the baffle body 301, and the baffle body 301 moves downwards and compresses the elastic components 400, in this case, the baffle body 301 is separated from the cooling unit support plate 200 for the cooling liquid to enter the storage units 600 via the liquid inlet holes; and when the cooling unit 100 is taken out of the tank body 200, the elastic components 400 push the baffle body 301 to be restored and attached to the cooling unit support plate 201 for sealing the liquid inlet holes, thereby preventing the cooling liquid from entering the storage units 600 via the liquid inlet holes.

Embodiment Five

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. Each spring-back baffle 300 comprises a baffle body 301, elastic components 400 located at the bottom of the baffle body 301, pins 303 and sealing gaskets located above the baffle body 301. The cooling unit support plate 201 is mounted in the inner lower part of the tank body 200 and is used for supporting the cooling unit 100, liquid inlet holes are provided on the cooling unit support plate 201, and the sealing gaskets can be fitted with the liquid inlet holes for sealing. When the cooling unit 100 is placed in the tank body 200, the cooling unit 100 is first in contact with the pins 303, the pins 303 are forced to transmit to the baffle body 301, and the baffle body 301 moves downwards and compresses the elastic components 400, in this case, the baffle body 301 is separated from the cooling unit support plate 200 and the sealing gaskets are separated from the liquid inlet holes, so that the cooling liquid enters the storage units 600 via the liquid inlet holes; and when the cooling unit 100 is taken out of the tank body 200, the elastic components 400 push the baffle body 301 to be restored until the sealing gaskets located above the baffle body 301 are attached to the liquid inlet holes of the cooling unit support plate 201 for sealing the liquid inlet holes, thereby preventing the cooling liquid from entering the storage units 600 via the liquid inlet holes.

Embodiment Six

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. Each spring-back baffle 300 comprises a baffle body 301, elastic components 400 and elastic component positioning recesses 302 located at the bottom of the baffle body 301, elastic component clearance recesses 204 are further provided at the bottom of the tank body 200, and two ends of each elastic component 400 are respectively located in the elastic component positioning recess 302 and the elastic component clearance recess 204. The cooling unit support plate 201 is mounted in the inner lower part of the tank body 200 and is used for supporting the cooling unit 100, liquid inlet holes are provided on the cooling unit support plate 201, and the sealing gaskets can be fitted with the liquid inlet holes for sealing. When the cooling unit 100 is placed in the tank body 200, the cooling unit 100 is first in contact with the pins 303, the pins 303 are forced to transmit to the baffle body 301, the baffle body 301 moves downwards and compresses the elastic components 400, and the elastic components 400 contract under the restriction of the elastic component positioning recesses 302 and the elastic component clearance recesses 204, in this case, the baffle body 301 is separated from the cooling unit support plate 200 and the sealing gaskets are separated from the liquid inlet holes, so that the cooling liquid enters the storage units 600 via the liquid inlet holes; and when the cooling unit 100 is taken out of the tank body 200, the elastic components 400 stretch under the restriction of the elastic component positioning recesses 302 and the elastic component clearance recesses 204 and push the baffle body 301 to be restored until the sealing gaskets located above the baffle body 301 are attached to the liquid inlet holes of the cooling unit support plate 201 for sealing the liquid inlet holes, thereby preventing the cooling liquid from entering the storage units 600 via the liquid inlet holes.

Embodiment Seven

An immersion water tank, comprising a tank body 200, obstructing plates 500, a cooling unit support plate 201 and spring-back baffles 300, the obstructing plates 500, the cooling unit support plate 201 and the spring-back baffles 300 being all mounted in the tank body 200. The spring-back baffles 300 are located between the cooling unit support plate 201 and a tank bottom of the tank body 200, a cooling liquid is contained in the tank body 200, the tank body 200 is divided into a plurality of storage units 600, and one cooling unit 100 can be placed in each storage unit 600. The obstructing plates 500 can be mounted between two adjacent storage units 600 and are used for obstructing adjacent storage units 600. Each spring-back baffle 300 comprises a baffle body 301, and elastic components 400 located at the bottom of the baffle body 301, elastic component fixing pins 203 are provided at the bottom of the tank body 200, and one end of each elastic component 400 is fixed to the elastic component fixing pin 203, preventing the elastic component 400 from falling off. The cooling unit support plate 201 is mounted in the inner lower part of the tank body 200 and is used for supporting the cooling unit 100, and liquid inlet holes are provided on the cooling unit support plate 201. When the cooling unit 100 is placed in the tank body 200, the baffle body 301 moves downwards, the elastic components 400 are compressed under the restriction of the elastic component fixing pins 203, and the baffle body 301 is separated from the cooling unit support plate 200 for the cooling liquid to enter the storage units 600 via the liquid inlet holes; and when the cooling unit 100 is taken out of the tank body 200, the elastic components 400 stretch under the restriction of the elastic component fixing pins 203 and push the baffle body 301 to be restored, and the baffle body 301 is attached to the cooling unit support plate 201 for sealing the liquid inlet holes, thereby preventing the cooling liquid from entering the storage units 600 via the liquid inlet holes.

Embodiment Eight

A cooling unit 100 is used as a server, in the immersion water tank, before a storage unit 600 node is maintained, obstructing plates 500 at two sides of the node are first inserted into tracks reserved in the water tank, and installation tracks for the obstructing plates 500 are required to be provided between the nodes in the water tank. The obstructing plates 500 are required to be higher than the liquid level after installation, and then the server to be maintained is pulled out after the obstructing plates 500 are positioned. In this case, due to the blocking of the obstructing plates 500, only the liquid level of the storage unit 600 in which the server to be maintained is located is reduced, and the liquid level of other storage unit 600 nodes that are in normal operation does not change. In addition, the design of a spring-back baffle 300 at the bottom of the water tank can effectively prevent a liquid in a liquid inlet from continuously flowing into the unused node. Please refer to FIGS. 2-3 for the operation mechanism of the spring-back baffle 300, when the server is not installed, the spring-back baffle 300 is lifted by the bottom elastic components 400 to block the liquid inlet holes, and when the server is installed, the spring-back baffle 300 can be pressed down by means of the structure of pins 303 on two sides of the baffle body 301 to open the liquid inlet holes, and the cooling liquid can flow smoothly into the storage units 600 at this time. As shown in FIGS. 4-6, the spring-back baffle 300 comprises a baffle body 301, pins 303 and sealing gaskets located above the baffle body 301, and elastic component positioning recesses 302 located below the baffle body 301. The size of the sealing gaskets must be provided to match the liquid inlet holes of the cooling unit support plate 201, the main purpose being that after the server node is removed, the bottom plate is pushed up so that the flexible sealing gaskets achieve a better blocking effect on the liquid inlet holes. The bottom elastic component positioning recesses 302 are mainly used to cooperate with the elastic components 400 below, preventing the elastic components 400 from being laterally displaced or bent when the baffle body 301 is operated, and ensuring that the elastic components 400 can actually operate in a straight up and down manner. Furthermore, it is necessary to provide elastic component clearance recesses 204 below the bottom of the tank body 200, which are mainly used to provide sufficient storage spaces for the elastic components 400 after being compressed, so as to ensure that a liquid flow path 800 is unobstructed, and elastic component fixing pins 203 are further provided in the elastic component clearance recess 204 for fixing the elastic components 400, so that the elastic components 400 are not deviated or even disconnected.

The immersion water tank has the following beneficial effects:

1. The Maintenance Manner of Existing Immersion Water Tank Servers is Improved

An important issue in the design of existing immersion water tanks is how to ensure that the same liquid level can be maintained while a server is being maintained, so that other servers that are in normal operation are not exposed to the risk of heat dissipation. With this design, not only can the liquid level be maintained, but the bottom spring-back baffle 300 can also play the role of a buffer when the server is repositioned to prevent damage caused by collision between the server and the bottom of the water tank.

2. The Usage Amount of the Working Cooling Liquid is Reduced

In the immersion water tank, regardless of the number of nodes to be maintained in the tank body 200, the amount of the cooling liquid used in the water tank can be controlled to be maintained at the same level as before the maintenance, without having to add more cooling liquid to be filled to maintain the same liquid level due to the number of nodes to be maintained.

3. The Operation Efficiency of the Water Tank is Improved

By means of the design of the spring-back baffles 300 at the bottom of the tank body 200, the liquid inlet holes at the unused storage unit 600 node are closed in a timely manner, thereby preventing unnecessary liquid from flowing into the unused storage unit 600 node, and achieving the effect of improving the operation efficiency of the water tank.

In addition to the immersion water tank above, some embodiments of the present disclosure further provide a server cooling system comprising the immersion water tank above. The server cooling system comprises a plurality of servers and an immersion water tank, and the servers are used as cooling units to perform cooling in the immersion water tank. For other parts of the structure of the server cooling system, reference can be made to the related art, and details will not be repeatedly described herein.

Hereinabove, the immersion water tank provided in some embodiments of the present disclosure are described in detail. The principle and embodiments of the present disclosure are described herein by applying specific examples, and the illustration of the embodiments above is only used to help understand the solution and core ideas of some embodiments of the present disclosure. It should be noted that, a person of ordinary skill in the art may further make a plurality of improvements and modifications to some embodiments of the present disclosure without departing from the principle of the present disclosure, and these improvements and modifications also belong to the scope of protection of the claims of the present disclosure.

What is claimed is:

1. An immersion water tank, comprising:

a tank body, configured to store a cooling liquid, a plurality of storage units for placing cooling units being provided in the tank body;

obstructing plates, detachably mounted on side walls of the tank body so as to obstruct the cooling liquid in the corresponding storage unit when the cooling unit is separated from the tank body;

a cooling unit support plate, mounted on the side of the interior of the tank body close to a tank bottom, the cooling unit support plate being provided with liquid inlet portions for the cooling liquid to flow into the storage units; and spring-back baffles, located below the cooling unit support plate, each spring-back baffle may block the liquid inlet portions when the cooling unit is separated from the cooling unit support plate.

2. The immersion water tank according to claim 1, wherein a plurality of limiting portions are provided on a side wall of the tank body in the longitudinal direction of the tank body, the limiting portions are located between adjacent storage units, and the obstructing plates are slidably connected to the limiting portions.

3. The immersion water tank according to claim 2, wherein each obstructing plate has a height greater than or equal to a height of the cooling unit support plate from the top of the tank body.

4. The immersion water tank according to claim 1, wherein the cooling unit support plate is provided with a plurality of liquid inlet portions at a position corresponding to each of the storage units.

5. The immersion water tank according to claim 4, wherein the liquid inlet portions are liquid inlet holes, and the liquid inlet holes are provided at a position on the cooling unit support plate close to the center of the storage unit.

6. The immersion water tank according to claim 1, wherein each spring-back baffle comprises a baffle body and elastic components which are mounted on the side of the baffle body close to the tank bottom; the elastic components may push the baffle body to be attached to the cooling unit support plate when the cooling unit is separated from the cooling unit support plate; and the cooling unit, when being close to the cooling unit support plate, may push the baffle body to compress the elastic components.

7. The immersion water tank according to claim 6, wherein pins are provided on the side of the baffle body close to the cooling unit support plate, and the pins pass through the cooling unit support plate; and when the cooling unit is close to the cooling unit support plate, the pins push the baffle body to move towards the tank bottom.

8. The immersion water tank according to claim 6, wherein the side of the baffle body close to the cooling unit support plate is provided with sealing components for blocking the liquid inlet portions, and the positions of the sealing components and the liquid inlet portions are in one-to-one correspondence.

9. The immersion water tank according to claim 8, wherein the sealing components are sealing gaskets, and the sealing gaskets have a size consistent with that of the liquid inlet portions.

10. The immersion water tank according to claim 9, wherein the liquid inlet portions are circular, and the sealing gaskets are annular.

11. The immersion water tank according to claim 6, wherein the side of the baffle body close to the tank bottom is provided with elastic component positioning portions for fixing the elastic components.

12. The immersion water tank according to claim 11, wherein each elastic component positioning portion is a boss provided on the baffle body, an elastic component positioning recess is provided in the boss, and a first end of each elastic component is mounted in the elastic component positioning recess.

13. The immersion water tank according to claim 6, wherein the tank bottom is provided with elastic component clearance recesses, and a second end of the elastic component is mounted in each elastic component clearance recess.

14. The immersion water tank according to claim 13, wherein a liquid flow channel for the cooling liquid to flow is provided between the cooling unit support plate and the tank bottom.

15. The immersion water tank according to claim 14, wherein the elastic component clearance recess is further provided therein with an elastic component fixing pin for fixing the elastic component.

16. The immersion water tank according to claim 1, wherein the cooling unit support plate is of an integral structure, and liquid inlet portions are provided on the cooling unit support plate at a position corresponding to each storage unit.

17. The immersion water tank according to claim 16, wherein the number of the spring-back baffles is the same as that of the storage units, and the positions of the spring-back baffles and the storage units are in one-to-one correspondence.

18. The immersion water tank according to claim 17, wherein the spring-back baffles have a size less than a cross-sectional size of the storage units.

19. The immersion water tank according to claim 1, further comprising a secondary water tank in communication with the tank body.

20. A server cooling system, comprising an immersion water tank, wherein the immersion water tank comprises:

a tank body, configured to store a cooling liquid, a plurality of storage units for placing cooling units being provided in the tank body;

obstructing plates, detachably mounted on side walls of the tank body so as to obstruct the cooling liquid in the corresponding storage unit when the cooling unit is separated from the tank body;

a cooling unit support plate, mounted on the side of the interior of the tank body close to a tank bottom, the cooling unit support plate being provided with liquid inlet portions for the cooling liquid to flow into the storage units; and spring-back baffles, located below the cooling unit support plate, each spring-back baffle may block the liquid inlet portions when the cooling unit is separated from the cooling unit support plate.

* * * * *